United States Patent
Pechenik

(10) Patent No.: US 6,365,059 B1
(45) Date of Patent: Apr. 2, 2002

(54) METHOD FOR MAKING A NANO-STAMP AND FOR FORMING, WITH THE STAMP, NANO-SIZE ELEMENTS ON A SUBSTRATE

(76) Inventor: Alexander Pechenik, 5107 Coleridge Dr., Fairfax, VA (US) 22032

( * ) Notice: Subject to any disclaimer, the term of this patent is extended or adjusted under 35 U.S.C. 154(b) by 0 days.

(21) Appl. No.: 09/560,375

(22) Filed: Apr. 28, 2000

(51) Int. Cl.$^7$ .................................................. B82B 3/00
(52) U.S. Cl. ............................ 216/52; 216/53; 216/56; 216/88; 216/100; 204/192.1; 204/192.15
(58) Field of Search .......................... 216/8, 9, 10, 11, 216/22, 41, 44, 52, 53, 56, 88, 100, 108; 204/192.1, 192.15, 192.32

(56) References Cited

U.S. PATENT DOCUMENTS

| | | | |
|---|---|---|---|
| 4,701,366 A | * 10/1987 | Deckman et al. | ............. 216/99 |
| 4,723,903 A | * 2/1988 | Okazaki et al. | ............. 425/385 |
| 5,147,763 A | * 9/1992 | Kamitakahara | ............. 430/320 |
| 5,486,404 A | 1/1996 | Nakajima et al. | ........... 428/172 |
| 5,735,985 A | 4/1998 | Ghosh et al. | ................. 156/89 |
| 5,772,905 A | 6/1998 | Chou | .......................... 216/44 |
| 5,783,295 A | * 7/1998 | Barnett et al. | .............. 428/216 |
| 5,817,242 A | 10/1998 | Biebuyck et al. | ............. 216/41 |
| 5,824,584 A | 10/1998 | Chen et al. | ................. 438/267 |
| 5,876,572 A | 3/1999 | Rickerby et al. | ........ 204/192.1 |
| 5,876,787 A | 3/1999 | Avarbz et al. | ................. 427/79 |
| 5,900,160 A | 5/1999 | Whitesides et al. | .......... 216/41 |
| 5,937,295 A | 8/1999 | Chen et al. | ................. 438/257 |
| 5,960,266 A | 9/1999 | Ishii et al. | ................... 438/161 |
| 6,016,269 A | 1/2000 | Peterson et al. | ............ 365/171 |
| 6,019,656 A | 2/2000 | Park et al. | ..................... 445/24 |
| 6,027,595 A | 2/2000 | Suleski | ........................ 156/230 |
| 6,033,583 A | 3/2000 | Musket et al. | ................. 216/56 |
| 6,034,389 A | 3/2000 | Burns, Jr. et al. | ........... 257/301 |
| 6,086,726 A | 7/2000 | Renk et al. | .............. 204/192.1 |
| 6,113,752 A | 9/2000 | Hollstein | ............... 204/192.12 |
| 6,120,844 A | 9/2000 | Chen et al. | ............ 427/255.28 |
| 6,159,558 A | 12/2000 | Wolfe et al. | ................. 427/523 |
| 6,165,567 A | 12/2000 | Ventzek et al. | ............. 427/576 |

* cited by examiner

*Primary Examiner*—Anita Alanko
(74) *Attorney, Agent, or Firm*—Thomas R. Vigil

(57) ABSTRACT

The stamping process and a method of fabrication of nano-stamps with characteristic dimensions below 1 nm and up to 100 nm intended for usage in making patterns of characteristic dimensions the same as those of the nano-stamp on surface of a substrate is provided. In the process a very hard stamp is fabricated by first depositing alternating layers of two materials, one of which has very high hardness, on some sacrificial substrate via PVD, CVD or any other deposition procedure that produces alternating layers of selected thickness, from sub 1 nm to above 100 nm. The layered film is then polished to an atomically smooth finish perpendicular to the plane of the layers and etched to produce dips in the softer layers. These steps produce a grid of parallel elevations and valleys on the etched surface, which now can be used as a stamp to stamp out patterns on a substrate of lower hardness than the hardness of the elevated layers. If the substrate is stamped twice with a turning of the stamp 90 degrees between first and second stampings, a square pattern of elevations or hills and valleys is formed, which can be used for magnetic memory storage by subsequently sputtering magnetic material on the tops of the elevations or hills.

5 Claims, 8 Drawing Sheets

METHOD FOR MAKING A NANO-STAMP AND FOR FORMING, WITH THE STAMP, NANO-SIZE ELEMENTS ON A SUBSTRATE

BACKGROUND OF THE INVENTION

1. Field of the Invention

The present invention relates to a method for making a nano-stamp and to a method which uses the stamp for producing structured patterns including nano-sized elements on the surface of a substrate for use in nano-scale electronic devices, such as integrated circuits (ICs), information storage devices, nano-photonic and opto-electronic devices, nano-biologic devices, nano-sensors and the like.

2. Description of the Prior Art

Lithography is the key procedure in industrial manufacturing of numerous small-scale devices, such as the semiconductor-based ICs, micro-electro-mechanical (MEMs) devices, and magnetic, optical, and electro-optical devices. In its well-known form, the process of lithography involves covering a given surface with a plastic material, called a "resist", which has the property of changing its atomic structure under exposure to energetic particles of electromagnetic or other type of radiation (ions, electrons, molecules, etc.). Then, an appropriately cut mask is placed on the resist, which is made of material impenetrable to the radiation, followed by exposing this surface through the mask to the flow of one of the above-mentioned types of radiation. Subsequently, the exposed areas of resist are dissolved in a special solution, which does not dissolve the unexposed parts of the polymer. Thus a pattern of polymer-covered and uncovered spots is produced on the surface, which subsequently is exposed to a variety of substances necessary for carrying out diffusion steps.

Modern day ICs, MEMs, and opto-electronic device manufacturing requires smaller and smaller patterns to be manufactured on a variety of substrates, particularly on Si, or $SiO_2$ substrates. Optical lithography has been the key for the industrial production of these devices; however, it is well known in the art of lithography that the resolution of the lithographic process is limited by half a wavelength of the electromagnetic radiation. As the size of the patterns shrinked below one micron, the radiation had to be changed from visible to UV, to soft X-ray. In addition to optical radiation, e-beam, ion-beam, atomic and molecular beam, and atomic scanning probe (ASP) are being investigated for possible applications in the area of industrial mass-production of electronic devices having elements with a characteristic dimension below 1 micron.

All of these technologies suffer from serious drawbacks and none is currently able to mass-produce patterns having elements below 50 nm.

Electron-beam lithography has been shown to achieve 10-nm lithographic resolution. A. N. Broers, J. M. Harper, and W. W. Molzen, Applied Phys. Lett. 33, 392 (1978) and P. B. Fisher and S. Y. Chou, Applied Physics Letters. 62, 2989 (1993) reported this kind of resolution, however their approach cannot be practically adapted for industrial production of nano-size patterns. On the other hand, X-ray lithography does not suffer from this detriment and can have a high throughput at 50 nm lithographic resolution, as was shown by K. Early, M. L. Shattenburg, H. I. Smith in Microelectronic Engineering 11, 317 (1990). However, X-ray lithography has not yet shown its ability to go below 50 nm in an industrial fashion.

Atomic scanning probes have shown lithographic resolution below 10 nm, but this procedure is inherently slow and it is yet to be determined if the ASP can fabricate the nano-patterns with necessary speed for mass production.

Another limitation of currently used approaches to lithography is their inherent complexity and the toxicity of the chemicals used for etching. The liquids used for etching out the patterns require special handling procedure to protect the health of the workers. Large resources are spent on safe disposal of waste products, which drives up the cost of the process.

An alternative approach to lithography is the compressive molding of thermoplastic polymers, a technology that has been around for several decades. One example of this technology is imprinted polymethyl methacrylate (PMMA) structures with a feature size on the order of 10 micrometers for making MEMs parts as disclosed by M. Harmening, W. Bacher, P. Bley, A. El-Kholi, H. Kalb, B. Kowanz, W. Mentz, A. Michel, and J. Mohr in Proceedings of IEEE Micro Electro Mechanical Systems, 202 (1992).

H. Lee and S. D. Senture produced molded micro-mechanical parts from polyester with a few tens of a micrometer on the side as described in Proceedings of 1992 13th IEEE/CHMT International Electronic Manufacturing Technology Symposium, 145.

Finally, S. Y. Chou, in U.S. Pat. No. 5,772,905 discloses a technique, which he calls "Nanoimprint Lithography", that utilizes the compressive molding of thermoplastic polymers approach to further reduce lithographic resolution down to sub-25 nm dimensions. In S. Y. Chou's approach, there is no need for any type of radiation and for masking the resist polymer. Instead the pattern is produced by pressing the mold, which has a nano-scale pattern of elevations and intrusions, into the polymer. How this pattern is produced on the mold is not specified. It is assumed that there exists a technique to do that. However, except for the highly inefficient ASP approach which requires enormous amounts of time to curve out even the simplest nano-scale patterns, there is currently no technique to fabricate nano-molds in an efficient way.

Examples of analogous and non-analogous structures with small elements and analogous and non-analogous methods for making structures with small elements are disclosed in the following analogous and non-analogous U.S. Patents.

| U.S. Pat. No. | PATENTEE |
| --- | --- |
| 5,486,404 | Nakajima et al. |
| 5,735,985 | Ghosh et al. |
| 5,772,905 | Chou |
| 5,871,242 | Biebuyck et al. |
| 5,824,584 | Chen et al. |
| 5,876,787 | Avarbz et al. |
| 5,900,160 | Whitesides et al. |
| 5,960,266 | Ishii et al. |
| 5,937,295 | Chen et al. |
| 6,033,583 | Musket et al. |
| 6,016,269 | Peterson et al. |
| 6,019,656 | Park et al. |
| 6,027,595 | Suleski |
| 6,034,389 | Burns et al. |

SUMMARY OF THE INVENTION

The present invention relates to a method and apparatus for fabrication of nano-stamps which either can be used in a process of nano-imprint lithography to produce nano-scale patterns on a thermoplastic polymeric film covering the surface of a selected substrate, or the nano-stamp can be used in a novel process of nano-stamping, which does away with the use of a resist polymer and with the etching of the substrate covered with the polymer and employs the step of stamping the substrate directly, which is possible due to the very high hardness and atomic-level smoothness of the nano-stamp fabricated by using the procedure and materials described herein.

The methods described herein relates to the fabrication of nano-stamps by a fundamentally different approach than has ever been used in any kind of stamping. It is noted that the technology of stamping has existed for thousands of years, as applied to minting of coins, for example. For those applications, stamps, or molds for stamps were carved, polished, or processed in some other way by using hand-held cutting tools. However, when pattern dimensions shrink down to nano-scale, in particular below 25 nm, the only carving tool available has been ASP, which, as described above, is a notoriously slow and inefficient tool.

To fabricate a tool capable of carving or stamping out patterns below 25 nm in size and potentially below 1 nm, the method of the present invention begins with forming a two-dimensional superlattice on a substrate, the exact nature of which is irrelevant in this case. The technique of forming two-dimensional superlattices has been known for decades. A two-dimensional superlattice comprises layers of dissimilar materials deposited upon each other in an alternating fashion. A number of different techniques have been used to fabricate two-dimensional superlattices in industry, such as physical vapor deposition (PVD) and chemical vapor deposition (CVD). These superlattices are characterized by the fact that the sum of thicknesses of the two alternating layers can be made as small as a few nanometers. In other words, the thickness of each individual layer can be as small as a few atomic units. One example of a two-dimensional superlattice is shown in FIG. 2 herein, where NbN and TiN alternating layers have a thickness of 20 nm. This two-dimensional superlattice was fabricated by using an unbalanced magnetron reactive sputtering technique, which produced coherent interfaces in the superlattices. As stated above, other techniques can be used to achieve similar layering of two materials and both coherent and incoherent interfaces can be used in practicing the methods of the present invention.

The next step of the method is to cut the produced superlattice in a plane perpendicular to the planes of the layers and to polish the produced surface to smooth, preferably atomically smooth finish. After it is polished, the polished surface should be as shown in FIG. 2 herein under TEM observation. This surface then is etched to remove one type of layers to some depth. The resulting grid will have distances between elevations determined by the thickness of the alternate layers of the superlattice. This grid of the nano-stamp then can be used for indenting a surface of a substrate in a direction perpendicular to the plane of grid lines in a surface of a substrate. By turning the grid of the nano-stamp 90 degrees in the plane of the substrate, it is possible to make a square pattern of hills and valleys in the surface of the substrate, which subsequently can be sputtered with some magnetic material, like nickel, for example, to fabricate a magnetic memory-type of device.

DESCRIPTION OF THE PREFERRED EMBODIMENT(S)

The present invention relates to a method and apparatus for creating and using a nano-stamp for forming high density elevations, elements or cells on a substrate with nano-scale features including nano-scale-resolution, high-throughput, and potentially low cost. The method of the present invention does not use energetic particles or beams; neither does it require polymer resist to be placed on the surface of a substrate. Instead, the method of the present invention relies on very fast and efficient manufacturing of a nano-stamp by utilizing PVD, CVD, or other surface deposition technique, to produce a two-dimensional nano-scale multi-layered thin film, processing this thin film into a nano-stamp by cutting it perpendicular to the plane of the layers, atomically polishing the new surface, etching out alternate layers to create alternate elevations, and then indenting a substrate with the grid of alternate elevations under a variety of angles to achieve a desired nano-scale pattern.

The method of the present invention offers many advantages over the current state of the art in nano-lithography. First, it has the major advantage of all imprint technologies of not using any energetic beams and particles to define the nano-scale pattern. It is well accepted in the current state of the art that energetic particles interfere and scatter into photo resist thus severely limiting resolution below 25 nm. On the other hand, the wave diffraction limits set by the wavelength of the electromagnetic radiation also present a natural limit for X-ray-based nano-lithography. The method of the present invention can easily produce patterns with close to 1 nm resolution, because superlattices with 1nm resolution have been manufactured. The method also has the advantage over other nano-imprint technologies of not using polymeric photo resist and thus not requiring the etching step, that is absolutely unavoidable to remove material in the nano-imprint lithography approach. The very high hardness of the nano-stamp fabricated following the procedures described herein makes possible the stamping of semiconductor surfaces without using polymers at all.

While it may be possible to create elements or cells with nano-resolution without the need for toxic chemicals using atomic scanning probe (ASP), there are some drawbacks using ASP. According to the current art, ASP is an extremely slow and time-consuming procedure, which cuts the surface one small step at-a-time. The nano-stamping approach of the present invention should make it possible to fabricate large areas of circuits with one stamping step. This advantage makes the present method of the present invention superior to any other approach currently being practiced in the existing art of nano-lithography. Based on these advantages, the method of the present invention may very well become vital for future mass scale manufacturing of nano-size circuits and other nano-scale devices.

Figure 1:
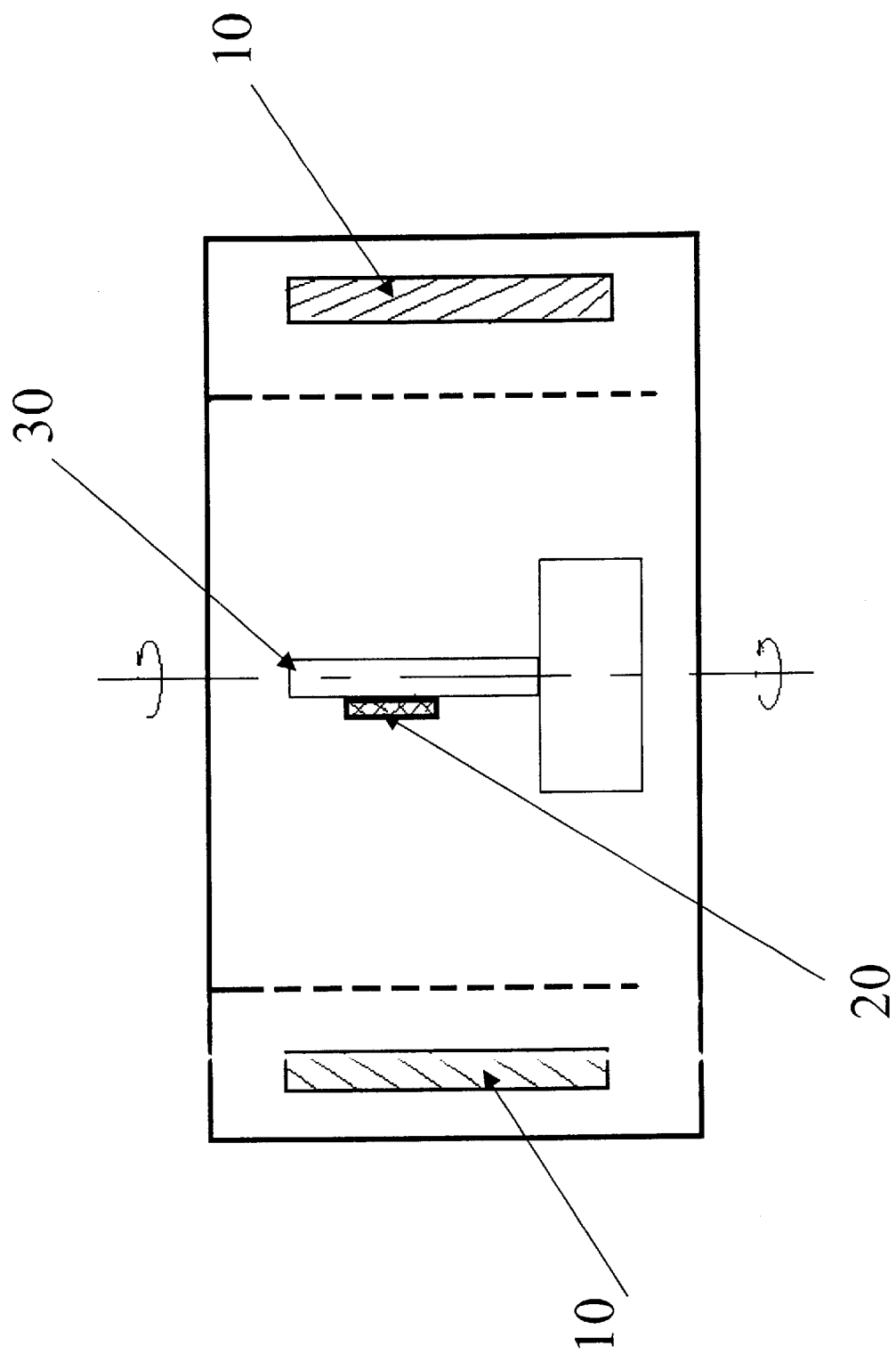
FIG. 1 is a block schematic diagram of an apparatus for reactive sputtering of superlattice thin films.

In FIG. 1 is shown the equipment that can be used to produce nano-layered two-dimensional superlattices. Although there are many techniques that can fabricate such layered materials, the opposed cathode, unbalanced magnetron sputtering system illustrated here is one of the most convenient and efficient ways of producing very high quality superlattices. It must be pointed out that the quality of the layers must be very high. The thickness of the layers must be atomically uniform over large distances and the technique illustrated here is known in the art as one of the most accurate in fabricating the uniform layers.

In FIG. 1, there is shown two targets 10 which react with reactive gas and reactively sputter layers of $ZrB_2$ and W on a substrate 20, which is fixed on a rotating substrate holder 30. Every full revolution of the holder 30 produces two layers, one $ZrB_2$ and one W.

Figure 2:
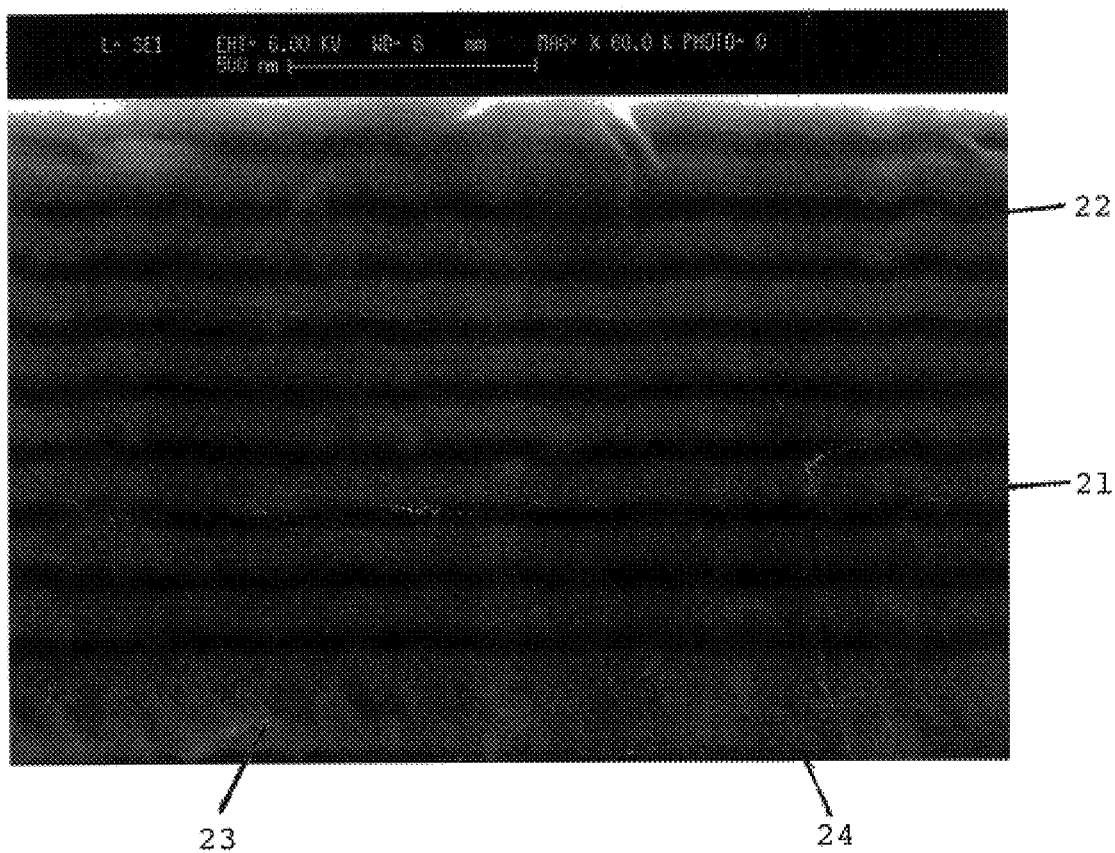
FIG. 2 is a photographic view of a two-dimensional superlattice coating cut perpendicular to the plane of 20 nm layers and shows the alternating materials of TiN in white and NbN in black.

FIG. 2 shows an example of cut and polished a nano-layered two-dimensional superlattice with 20 nm thick layers. The material in this example is TiN, layer 21 and NbN, layer 22. Though these materials work well, after an appropriate etchant is found that works on one of them and not on the other, the preferred embodiment of this invention is to have $ZrB_2$ and W as alternating layer materials. $ZrB_2$ is a material of exceptional hardness, Hv 3000, and thus easily can make indentations in most substrate materials, such as Si or $SiO_2$, for example and W is quite easy to etch out with a mild aqueous solution of sulfuric acid, which will leave $ZrB_2$ intact. Fabrication of such films has been reported. In the illustrated case, the nano-layered film is fabricated on a steel substrate 23 covered with a Ti interlayer 24. The purpose of substrate 23 and layer 24 is to assist in fabrication of the nano-layered film and their exact nature is not important for the final product, which is the nano-stamp based on layers 21 and 22.

Figure 3:
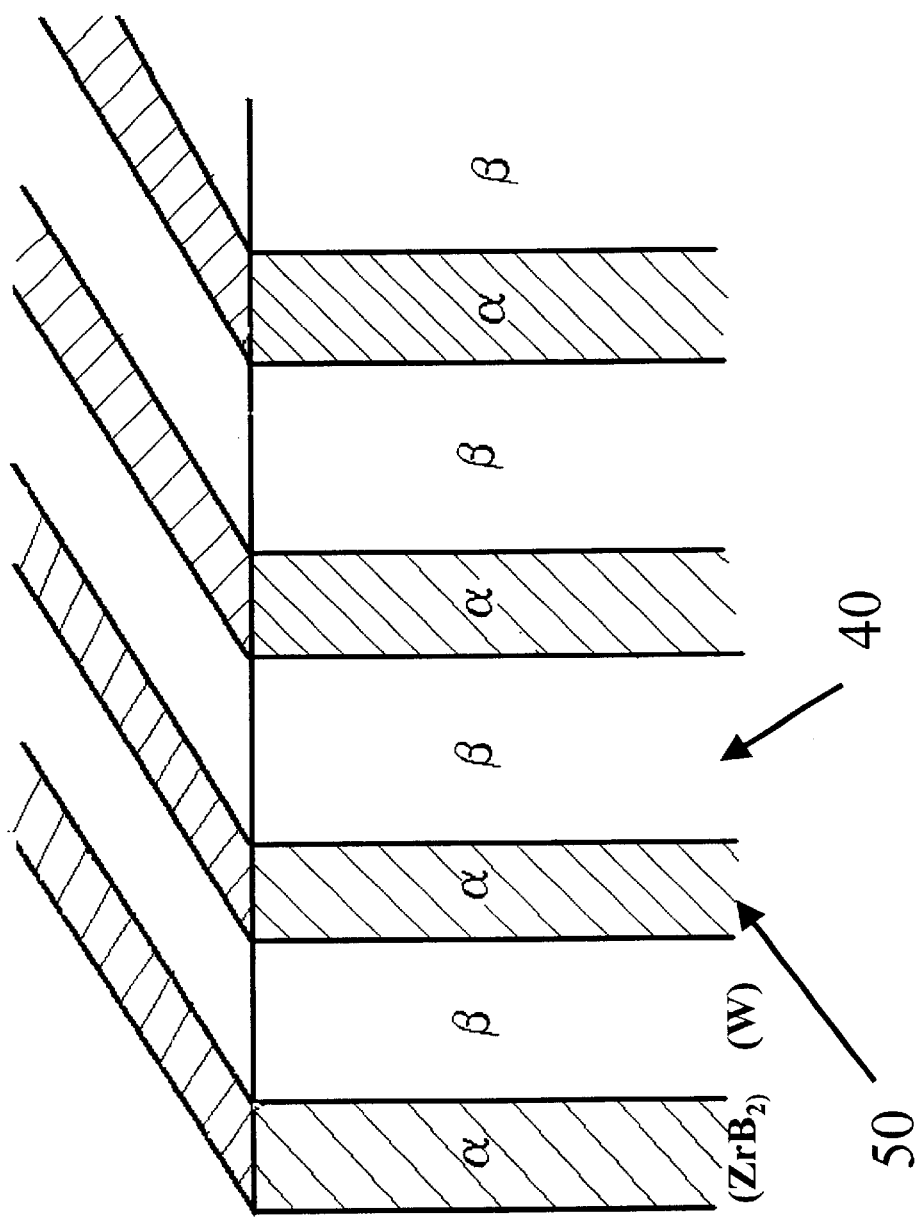
FIG. 3 is a fragmentary view of the alternating layers of the superlattice shown in FIG. 2 after atomic polishing.

FIG. 3 illustrates the step in the fabrication of the nano-stamp when the layered material has been cut and polished to an atomically smooth finish. The cutting procedure can be accomplished either by cleaving, which simply means careful breaking along a plane perpendicular to the layered planes, or by using a diamond saw or a laser cutting technique. The cutting procedure must be followed by a polishing step to remove all the damage introduced by cutting and to achieve an atomically smooth finish on the surface intended for nano-indenting. Such polishing can be accomplished by mechano-chemical means or by plasma etching, or by ion and reactive ion milling. The exact procedures are well established in the art of surface polishing.

In FIG. 3, the result of uniform polishing is illustrated. However the uniform removal of material does not have to be the case. If the materials of the layers are not removed uniformly by the polishing procedure, then a structure similar to the structure shown in FIG. 4 will result. What is important, however, is that the elevations need to be of nearly equal atomic height.

Figure 4:
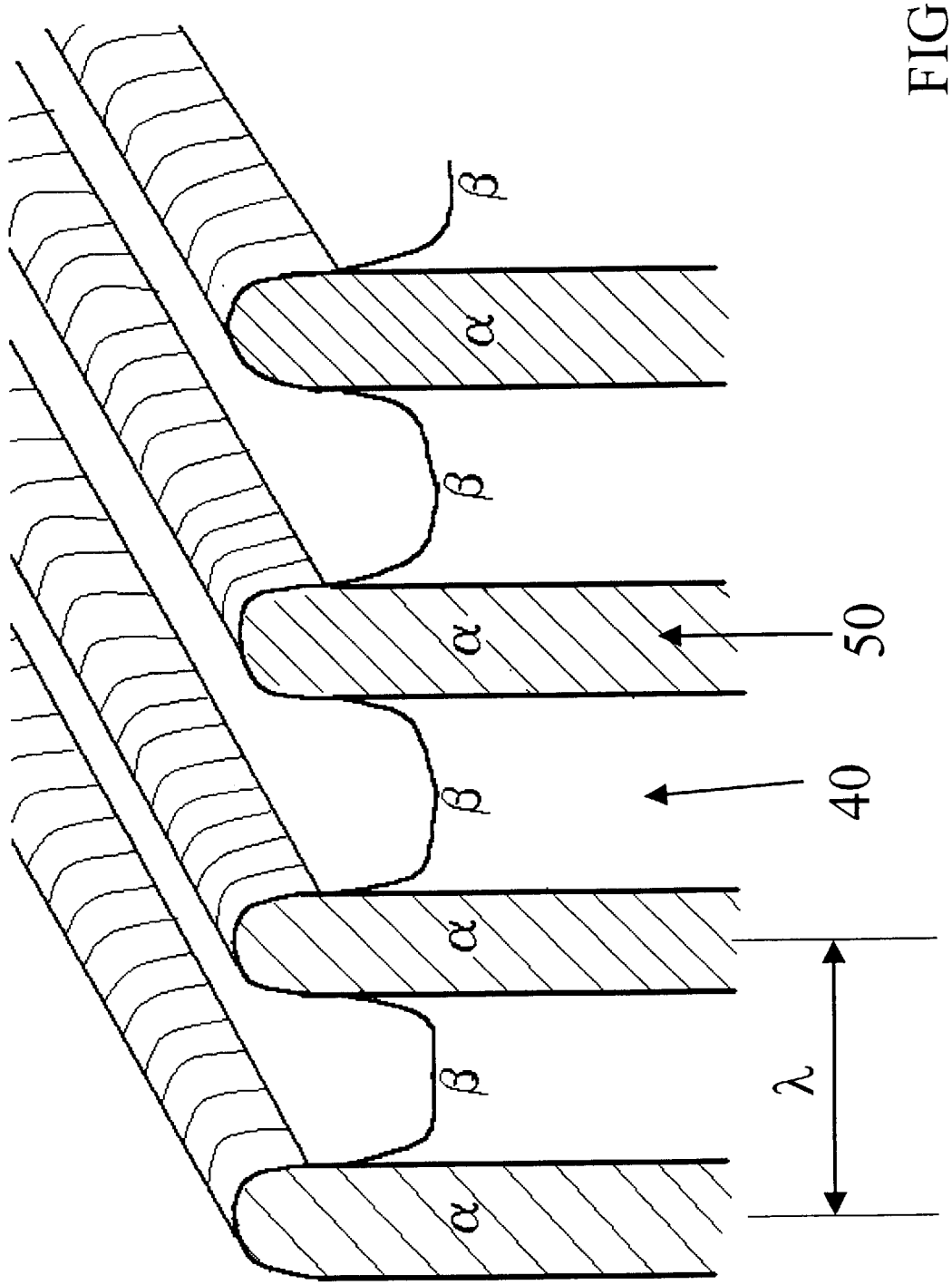
FIG. 4 is a fragmentary perspective view showing the grid formed on one surface of the supperlattice shown in FIG. 3 after etching to form a nano-stamp of the present invention.

The next step, illustrated in FIG. 4 might or might not be necessary depending on the results of the previous step. FIG. 4 illustrates the state of the nano-stamp after the last stage of fabrication, which is etching of the surface of the nano-stamp to achieve needed depth of the grooves. Each groove 40 corresponds to the material W and each elevation 50 to the material $ZrB_2$. To achieve the necessary results, in one preferred method of the present invention where the $ZrB_2$/W combination is used, is to use a weak aqueous solution of sulfuric acid to etch out the edge of the W layer, namely form groove 40 leaving the layer $ZrB_2$, elevation layer 50, intact.

Figure 5A:
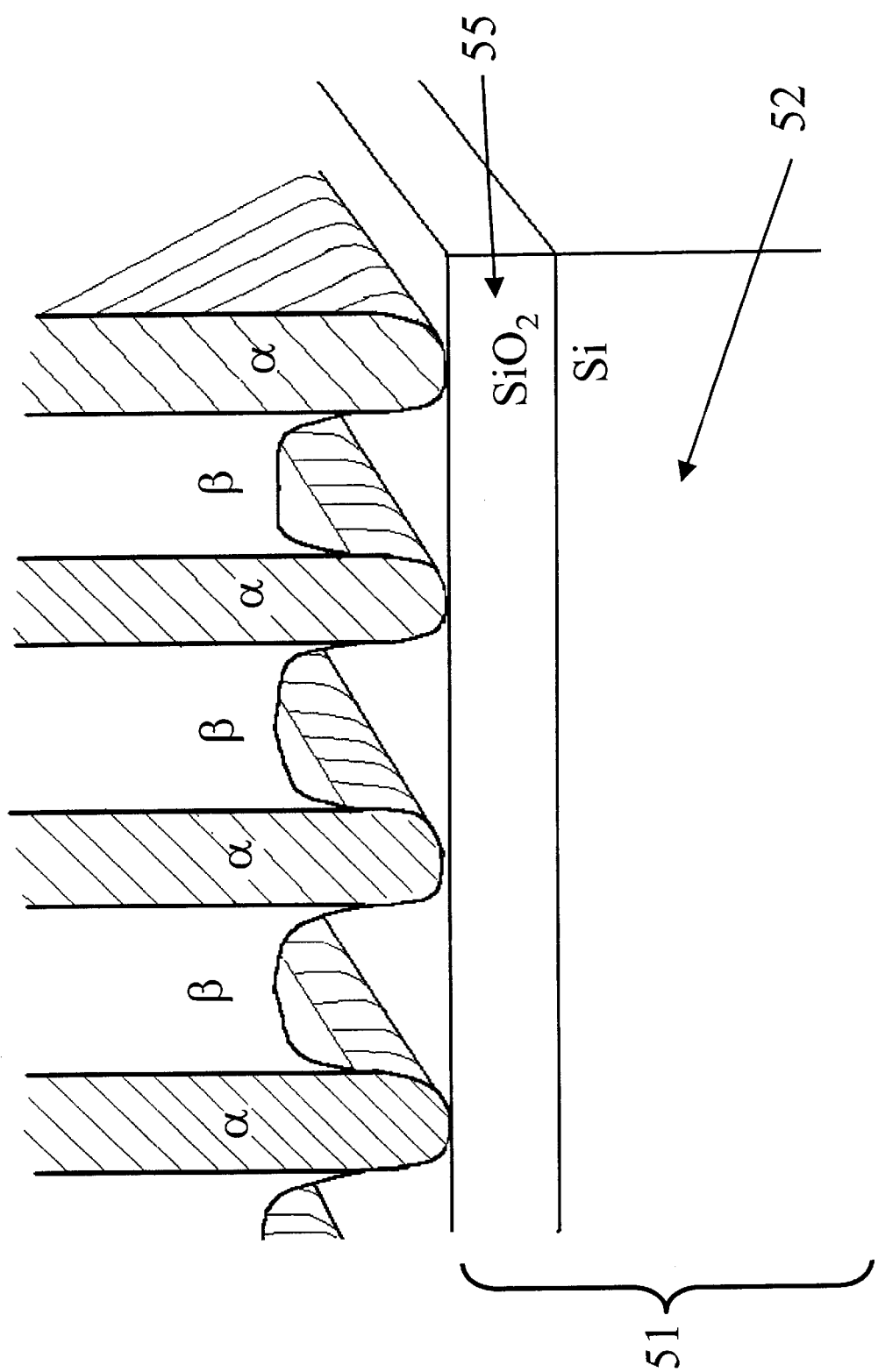
FIG. 5a illustrates schematically in a perspective view the process of indenting the surface of an Si/SiO$_2$ substrate with the nano-stamp to form a set of grooves on or in the substrate.
Figure 5B:
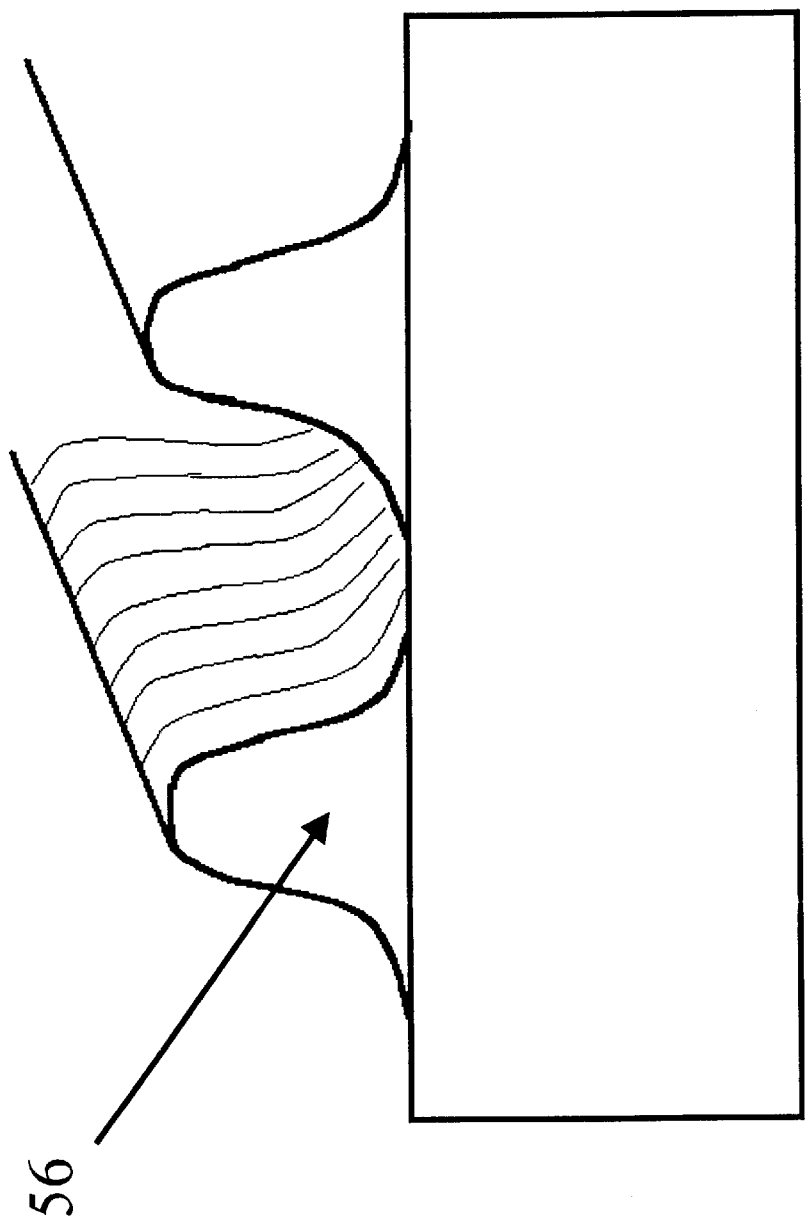
FIG. 5b is a fragmentary perspective view of a corner of the substrate shown in FIG. 5a but without the nano-stamp to show better the ridges or elevations and valleys formed by the nano-stamp in the substrate.

FIG. 5 shows schematically the application of the nano-stamp to a layered substrate 51 having a base substrate layer 52 made of Si and an upper substrate layer 55 made of $SiO_2$ for fabricating long grooves 40 on the surface of the upper substrate layer 55 to form the elevation line 50 covered in the thin substrate layer 55 made of $SiO_2$. As was explained above, no masking is required in this process. The layer of $ZrB_2$ is a much harder material than $SiO_2$ (Hv=3,000 for $ZrB_2$ vs. Hv=1000 for $SiO_2$). Accordingly, $SiO_2$ will flow into the grooves 56 and the resulting pattern on the surface of the silicon substrate will be as shown in FIG. 5b.

Figure 6:
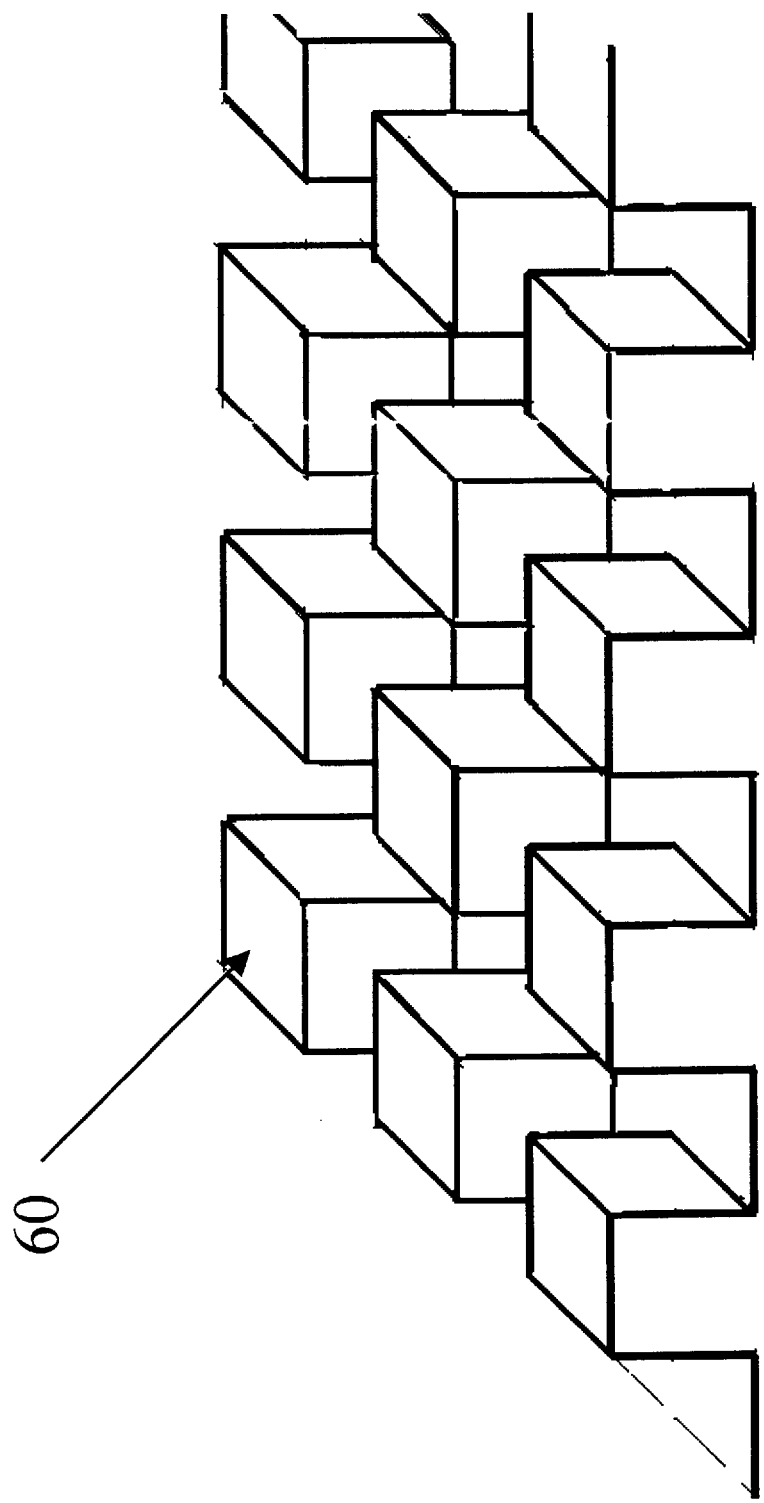
FIG. 6 is a fragmentary perspective view of a set of elevations produced on the surface after two stamping steps 90 degrees offset from each other.

In FIG. 6 is illustrated, schematically, the next step in the method or procedure for fabricating a memory-type device using nano-stamping. A subsequent indentation or nano-stamping step added to the nano-stamping step performed in the structure shown in FIG. 5 produces a set of perpendicular grooves to the ones produced in the FIG. 5 nano-stamping step. This is done by turning the nano-stamp 90 degrees bout its axis and then indenting the upper substrate surface 55. If the depth of the indentation is sufficient, the elevations 60 created will be formed of entirely of $SiO_2$, and the valleys 40 will be formed of entirely Si.

The elevations or hills 60 can be generally square with a lateral extent between 1 nm and 100 nm, although a lateral extent of between approximately 1 nm and 25 nm is preferred.

If some $SiO_2$ still remain in the valleys, it can be easily etched out, if this is needed, by an appropriate etchant.

Figure 7:
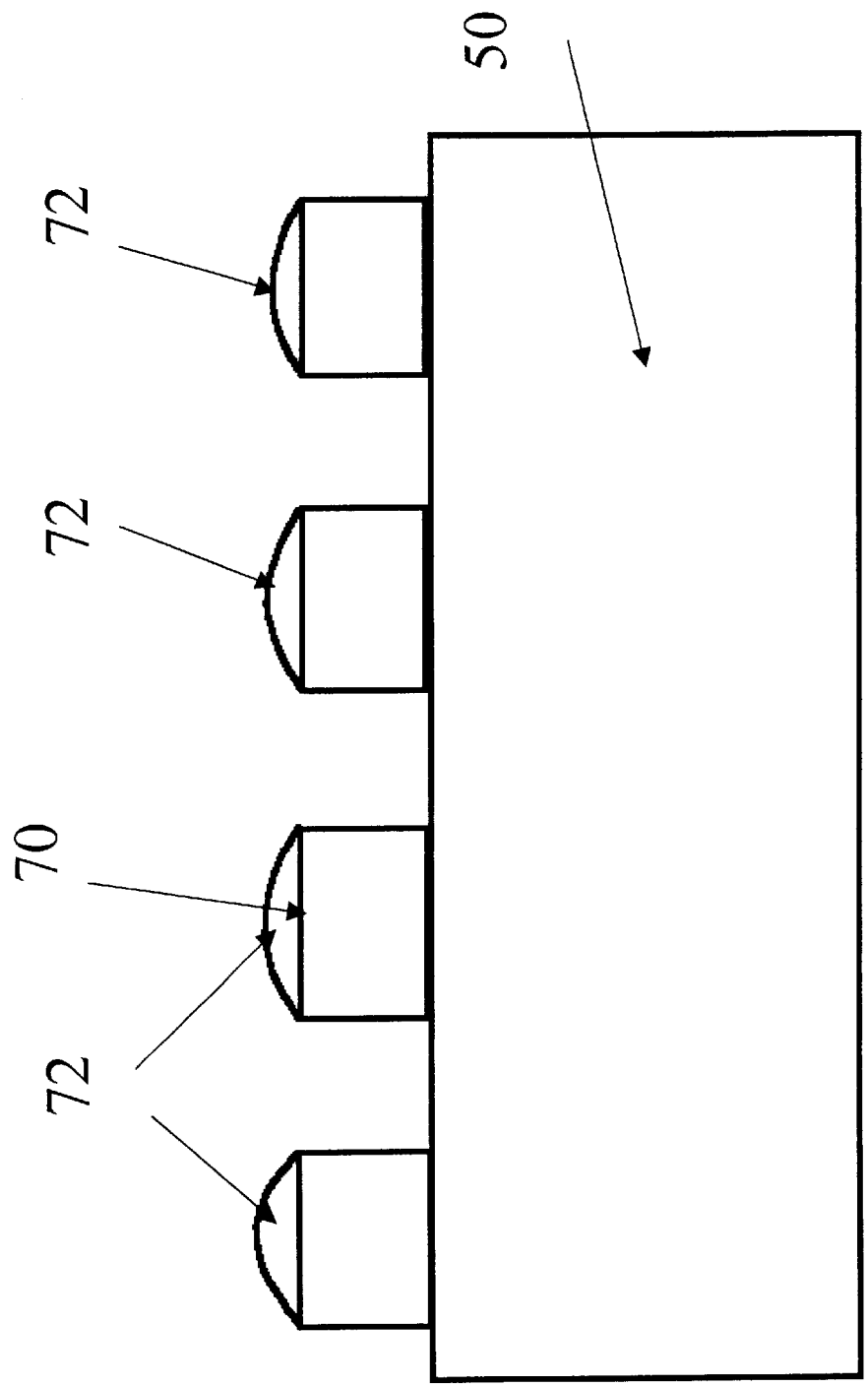
FIG. 7 is a fragmentary perspective view of the generally square elevations or elements formed in the substrate after the two, 90 degrees apart, stampings and after a magnetic material is sputtered on the tops of the generally square elevations.

FIG. 7 illustrates schematically the results of high angle sputtering, which is a line of sight type procedure that deposits materials only on the tops 70 of the elevations 60. If a top layer 72 of Ni is deposited on the tops 70 of the elevations 60, the produced array of metallized sites 72 can be utilized as a magnetic memory device. Each individual top or hat 72 can be magnetized up or down in the plane of the drawing by a magnetic scanning probe, which also can be used to read this information.

The operations described above will require precise alignment and orientation techniques. Such techniques are known to those skilled in the art of nano-lithography. For example, Nomura et al. teaches A MOIRE ALIGNMENT TECHNIQUE FOR MIX AND MATCH LITHOGRAPHIC SYSTEM, J. Vac. Sci. Technol. B6(1) Jan/Feb 1988, 394, and Hare et al. teaches AN ALIGNMENT TECHNIQUE USING DEFRACTED MOIRE SIGNALS, J. Vac. Sci. Technol, B7(6), Nov/Dec 1989, 1977.

The methods of the present invention and the structures created thereby are not limited to fabricating memory-type devices. The methods can also be applied to MOSFET-type devices by doping Si substrate with boron and then metallizing the tops or hats and connecting them in some pattern. If an insulating substrate is used, such devices as multi-electron quantum dots can be fabricated with the electrons stabilized by Colombic stabilization. If a conducting substrate is employed for the substrate 52 and piezoelectric material is used for elevations 55, then a square grid of piezoelectric elevations 60 can be produced with electrodes 72. Such device might be useful in manipulation of molecules attached to the surface.

Also the methods can be used in the fabrication of highly efficient cathalithic supports and nano-photonic devices. The essential part of all these applications is the fast and efficient procedure for nano-stamp fabrication and nano-indenting using the techniques described above.

From the foregoing description, it will be apparent that the methods of the present invention and the structures of the present invention made by the methods have a number of advantages, some of which have been described above and others of which are inherent in the invention. Also modifications can be made to the methods and structures of the present invention without departing from the teachings of the invention. Accordingly, the scope of the invention is only to be limited as necessitated by the accompanying claims.

I claim:

1. A method for making a nano-stamp comprising the steps of:

sputtering a first layer of one type of material on a substrate;

sputtering a second layer of a second material on top of the first layer;

repeating the two previous steps until a superlattice structure having a desired number of alternate layers of different material has been formed;

cutting through the superlattice structure transverse to the layers;

atomically polishing the cut surface of the superlattice; and applying an etchant material to etch away the softer one of the alternate layers of material in the superlattice to a sufficient depth thereby to form a nano-stamp comprising a grid of very thin line edges separated by very thin spacings on the order of 25 nanometers or less and as low as 1 nanometer.

2. The method of claim 1 wherein the layer of harder material is made of $ZrB_2$.

3. The method of claim 1 wherein the layer of softer material is made of W.

4. The method of claim 1 wherein the etchant includes sulphuric acid.

5. A method for making a nano-stamp comprising the steps of:

sputtering a first layer of one type of material on a substrate;

sputtering a second layer of a second material on top of the first layer;

repeating the two previous steps until a superlattice structure having a desired number of alternate layers of different material has been formed;

cutting through the superlattice structure transverse to the layers;

atomically polishing the cut surface of the superlattice; and applying an etchant material to etch away the softer one of the alternate layers of material in the superlattice to a sufficient depth thereby to form a nano-stamp comprising a grid of line edges separated by spacings.

* * * * *